(12) United States Patent
Sato

(10) Patent No.: US 9,385,302 B2
(45) Date of Patent: Jul. 5, 2016

(54) MULTI-LAYER ELECTRONIC COMPONENT AND METHOD FOR MANUFACTURING THE SAME

(71) Applicant: KYOCERA CORPORATION, Kyoto-shi, Kyoto (JP)

(72) Inventor: Masahiro Sato, Kirishima (JP)

(73) Assignee: KYOCERA CORPORATION, Kyoto-shi (JP)

( * ) Notice: Subject to any disclaimer, the term of this patent is extended or adjusted under 35 U.S.C. 154(b) by 347 days.

(21) Appl. No.: 13/914,382

(22) Filed: Jun. 10, 2013

(65) Prior Publication Data
US 2013/0270969 A1    Oct. 17, 2013

Related U.S. Application Data

(62) Division of application No. 12/095,484, filed as application No. PCT/JP2006/323715 on Nov. 28, 2006, now Pat. No. 8,669,694.

(30) Foreign Application Priority Data

Nov. 29, 2005 (JP) ................................. 2005-343492
Oct. 27, 2006 (JP) ................................. 2006-292384

(51) Int. Cl.
*H01L 41/047* (2006.01)
*H01L 41/277* (2013.01)
(Continued)

(52) U.S. Cl.
CPC .......... *H01L 41/277* (2013.01); *H01L 41/0471* (2013.01); *H01L 41/083* (2013.01); *H01L 41/1876* (2013.01); *H01L 41/273* (2013.01); *Y10T 29/42* (2015.01)

(58) Field of Classification Search
CPC .............. H01L 41/083; H01L 41/1876; H01L 41/0471; H01L 41/273; H01L 41/277
USPC .................... 310/358, 328, 363, 366
See application file for complete search history.

(56) References Cited

U.S. PATENT DOCUMENTS 4,469,619 A    9/1984 Ohno et al.
4,643,984 A    2/1987 Abe et al. ...................... 501/134
(Continued)

FOREIGN PATENT DOCUMENTS

JP      64-014172       1/1989
JP      03-004583 A     1/1991
(Continued)

OTHER PUBLICATIONS

United States Office Action, U.S. Appl. No. 13/914,395, Jul. 22, 2015, 13 pgs.
(Continued)

*Primary Examiner* — Thomas Dougherty
*Assistant Examiner* — Karen B Addison
(74) *Attorney, Agent, or Firm* — Volpe and Koenig, P.C.

(57) ABSTRACT

A multi-layer electronic component that can be repetitively operated under high voltage, high temperature and high humidity is provided. The multi-layer electronic component comprises a plurality of dielectric material layers made of a sintered material having perovskite structure that includes Pb; and a plurality of internal electrodes, the dielectric material layers and the internal electrodes being stacked alternately one on another, wherein lead compound that remains in the crystal grain boundaries of the dielectric material layers is controlled so that the number of grains of the lead compound not smaller than 0.01 μm are 2 or less per 100 μm² on average.

4 Claims, 5 Drawing Sheets

(51) Int. Cl.
*H01L 41/083* (2006.01)
*H01L 41/187* (2006.01)
*H01L 41/273* (2013.01)

(56) References Cited

U.S. PATENT DOCUMENTS

| | | | |
|---|---|---|---|
| 5,126,618 A * | 6/1992 | Takahashi | H01L 41/083 310/328 |
| 5,164,882 A | 11/1992 | Kanai et al. | 361/321.5 |
| 5,258,160 A * | 11/1993 | Utsumi | A61M 25/0054 264/167 |
| 5,348,775 A | 9/1994 | Lin | 427/555 |
| 5,438,232 A * | 8/1995 | Inoue | H01L 41/083 310/328 |
| 5,790,156 A | 8/1998 | Mutton et al. | |
| 5,828,160 A | 10/1998 | Sugishita | |
| 5,886,717 A | 3/1999 | Satake et al. | 247/70 |
| 6,205,015 B1 | 3/2001 | Wada et al. | 361/321.4 |
| 7,176,155 B2 | 2/2007 | Kashiwaya et al. | 501/134 |
| 7,679,272 B2 | 3/2010 | Okamura et al. | |
| 7,759,847 B2 | 7/2010 | Okamura et al. | |
| 7,902,726 B2 | 3/2011 | Okamura et al. | |
| 2003/0062806 A1 | 4/2003 | Ikeda et al. | 310/332 |
| 2004/0189751 A1 | 9/2004 | Kanno et al. | 347/68 |
| 2004/0238100 A1 | 12/2004 | Minami et al. | |
| 2004/0238784 A1 | 12/2004 | Helke | 252/62.9 PZ |
| 2005/0082943 A1 | 4/2005 | Kubota et al. | 310/311 |
| 2005/0206274 A1 | 9/2005 | Kobane et al. | 310/328 |
| 2007/0046148 A1 | 3/2007 | Sugg | |
| 2007/0152542 A1 * | 7/2007 | Walter | H01L 41/053 310/366 |
| 2007/0205700 A1 | 9/2007 | Okamura et al. | |
| 2008/0303385 A1 | 12/2008 | Okamura et al. | |

FOREIGN PATENT DOCUMENTS

| | | |
|---|---|---|
| JP | 08-116684 | 5/1996 |
| JP | 2004-284900 | 10/2004 |
| JP | 2005-159042 | 6/2005 |
| JP | 2005-235863 | 9/2005 |
| JP | 2006-128357 | 5/2006 |
| WO | WO 0193345 | 12/2001 |
| WO | WO 03/070641 A1 | 8/2003 |
| WO | WO 2005031887 | 4/2005 |
| WO | 2005053046 A1 | 6/2005 |
| WO | 2005069394 A1 | 7/2005 |

OTHER PUBLICATIONS

Extended European search report dated Nov. 8, 2012 issued in corresponding European application 06833519.9.
Extended European search report dated Jul. 3, 2013 issued in corresponding European application 13165714.0 cites the U.S. patent and foreign patent documents listed above.

* cited by examiner

MULTI-LAYER ELECTRONIC COMPONENT AND METHOD FOR MANUFACTURING THE SAME

TECHNICAL FIELD

The present invention relates to a multi-layer electronic component suitably used in, for example, drive element for precision positioning device or vibration preventing device for an optical apparatus or a multi-layer piezoelectric component such as ceramic filter, ultrasonic oscillator, piezoelectric buzzer, piezoelectric ignition unit, ultrasonic motor or piezoelectric fan, and piezoelectric sensor acceleration sensor, knocking sensor or AE sensor.

BACKGROUND ART

A piezoelectric material has piezoelectric effect of generating electromotive force in response to an external pressure and reverse piezoelectric effect of expanding and contracting in response to a voltage applied thereto. Various piezoelectric devices have been manufactured by making use of these effects. However, since the magnitudes of the piezoelectric effect and the reverse piezoelectric effect obtained from one sheet of piezoelectric material are very small, a plurality of sheets of piezoelectric material have been stacked to provide a multi-layer electronic component.

The multi-layer electronic component of the prior art is manufactured by forming a stack of column-like configuration (for example, rectangular prism) from dielectric material layers and internal electrode layers placed alternately one on another, and firing the dielectric material layers and internal electrode layers that constitute the stack at the same time. The plurality of internal electrodes are exposed alternately in either of opposing side faces among the four side faces of the column-shaped stack. External electrodes are formed on the two side faces where the internal electrodes are exposed, and the internal electrodes are connected alternately to either of the two external electrodes in every other layer.

The multi-layer electronic component of the prior art is obtained by forming the column-shaped stack constituted from a plurality of green ceramic sheets having a paste printed thereon to form the internal electrodes, placed one on another, and firing the column-shaped stack in a crucible made of ceramics (refer to, for example, Japanese Unexamined Patent Publication (Kokai) No. 2004-284900).

DISCLOSURE OF THE INVENTION

Problem to be Solved by the Invention

Demands for multi-layer electronic components have been rapidly increasing in the field of automobile in recent years, such as the piezoelectric filters used in high frequency ranges and the piezoelectric transducer used at high voltages. These onboard applications require components having high durability in harsh environment. Also because these components are intended to operate over a wide range of temperatures, high heat resistance such as sufficient strength at high temperatures and high humidity resistance are required, in particular.

An object of the present invention is to provide a multi-layer electronic component that can be repetitively operated under high voltage, high temperature and high humidity.

Means for Solving Problem

First multi-layer electronic component of the present invention comprises a plurality of dielectric material layers made of a sintered material having perovskite structure that includes Pb; and a plurality of internal electrodes, the dielectric material layers and the internal electrodes being stacked alternately one on another, wherein lead compound that remains in the crystal grain boundaries of the dielectric material layers is controlled so that the number of grains of the lead compound not smaller than 0.01 µm are 2 or less per 100 µm$^2$ on average.

Second multi-layer electronic component of the present invention comprises a plurality of dielectric material layers made of a sintered material having perovskite structure that includes Pb and Zr; and a plurality of internal electrodes, the dielectric material layers and the internal electrodes being stacked alternately one on another, wherein content of lead compound that remains in the crystal grain boundaries of the dielectric material layers is controlled so that, when the dielectric material layer is dissolved in acetic acid, concentration of lead eluted from the lead compound in the acetic acid is 100 times or less of the concentration of Zr eluted from the crystal grains in the acetic acid.

In the first and second multi-layer electronic components of the present invention, it is preferable that a compound of group 2 element is precipitated in the crystal grain boundaries which are exposed on the surface of the dielectric material layer.

Third multi-layer electronic component of the present invention comprises a plurality of dielectric material layers including lead and a plurality of internal electrodes that are stacked alternately one on another, wherein the number of lead compound particles which have particle size not smaller than 0.01 µm is 2 or less per observation area of 100 µm$^2$.

Fourth multi-layer electronic component of the present invention comprises a plurality of dielectric material layers including lead and a plurality of internal electrodes that are stacked alternately one on another, wherein a compound of group 2 element is precipitated in the crystal grain boundaries of the dielectric material layer on the surface of the multi-layer electronic component.

First method for manufacturing the multi-layer electronic component of the present invention, that includes a plurality of dielectric material layers including lead and a plurality of internal electrodes. The first method comprises;

a step of forming a stack by placing sheets that include a dielectric material powder that would be turned into the dielectric material layers and a metal powder that would be turned into the internal electrodes alternately one on another; and a step of firing, wherein the step of firing includes a first firing step and a second firing step of different firing conditions, the second firing step being carried out at a firing temperature higher than that of the first firing step, in a firing atmosphere having a pressure that is equal to or lower than that of the first firing step and concentration of lead that is equal to or lower than that of the first firing step.

Second method for manufacturing the multi-layer electronic component of the present invention, that includes a plurality of dielectric material layers including Pb and a plurality of internal electrodes. The Second method comprises:

a step of forming a stack by placing sheets including a dielectric material powder that would be turned into the dielectric material layers and a metal powder that would be turned into the internal electrodes alternately one on another; and a step of firing, wherein the step of firing includes a first firing step and a second firing step, the first firing step being carried out by keeping a crucible, with the stack being placed therein, airtight and the second firing step being carried out by keeping the crucible partially open, and wherein the firing temperature in the second firing step is higher than that of the first firing step.

Third method for manufacturing the multi-layer electronic component of the present invention, that includes a plurality of dielectric material layers including lead and a plurality of internal electrodes which are laminated one on another. The third method comprises:

a step of forming a green compact of stack by stacking a plurality of green compacts that include a powder of dielectric material that includes lead and a plurality of internal electrodes formed mainly from a metallic material;

a first firing step where the green compact of stack is fired in an atmosphere including lead in a crucible; and a second firing step where the green compact of stack is fired in an atmosphere including lead of lower concentration at a temperature higher than in the first firing step, wherein liquid phase that includes lead is generated in the grain boundaries of the dielectric material and the metallic material in the first firing step, and lead in the liquid phase is purged out of the stack in the second firing step.

Fifth multi-layer electronic component of the present invention comprises:

an active stack section constituted from a plurality of dielectric material layers including lead and a plurality of internal electrodes which are stacked alternately one on another;

an upper inactive section provided on the top surface of the active stack section in the stacking direction thereof; and a lower inactive section provided on the bottom surface of the active stack section in the stacking direction thereof, wherein dielectric constant $\in1$ of a first upper dielectric material layer disposed between an uppermost inner electrode that located at the top and an internal electrode located next to the uppermost inner electrode and dielectric constant $\in2$ of a first lower dielectric material layer disposed between a lowermost inner electrode that is located at the bottom and a second lower internal electrode located next to the lowermost inner electrode are larger than dielectric constant $\in3$ of a central dielectric material layer disposed at the center of the active stack.

The first to fifth multi-layer electronic components of the present invention can be manufactured by either of the first to third manufacturing methods of the present invention.

The first to fifth multi-layer electronic components of the present invention constituted as described above and the multi-layer electronic components manufactured by the first to third manufacturing methods of the present invention have high strength due to high heat resistance of the grain boundaries, even when used at a high temperature. Moreover, high humidity resistance is provided by preventing moisture from infiltrating to the inside of the ceramic material. Thus the present invention provides the multi-layer electronic component having high reliability that can be preferably used as a component that is repetitively operated under high voltage, high temperature and high humidity such as components mounted on vehicles.

In the first and third multi-layer electronic components of the present invention, the number of grains of lead compound not smaller than 0.01 μm present in the crystal grain boundaries of the dielectric material layer per 100 μm² of observation area is 2 or less, and therefore the dielectric material can be prevented from undergoing phase transition and reaction can be suppressed from occurring between the components of the electrode and the lead component.

In the fourth multi-layer electronic component of the present invention where compounds of group 2 element are precipitated on the surface, moisture can be prevented from infiltrating to the inside of the ceramic material. As a result, the multi-layer electronic component that shows high durability when repetitively operated under high voltage, high temperature and high humidity is provided.

BRIEF DESCRIPTION OF REFERENCE NUMERALS

Figure 1:
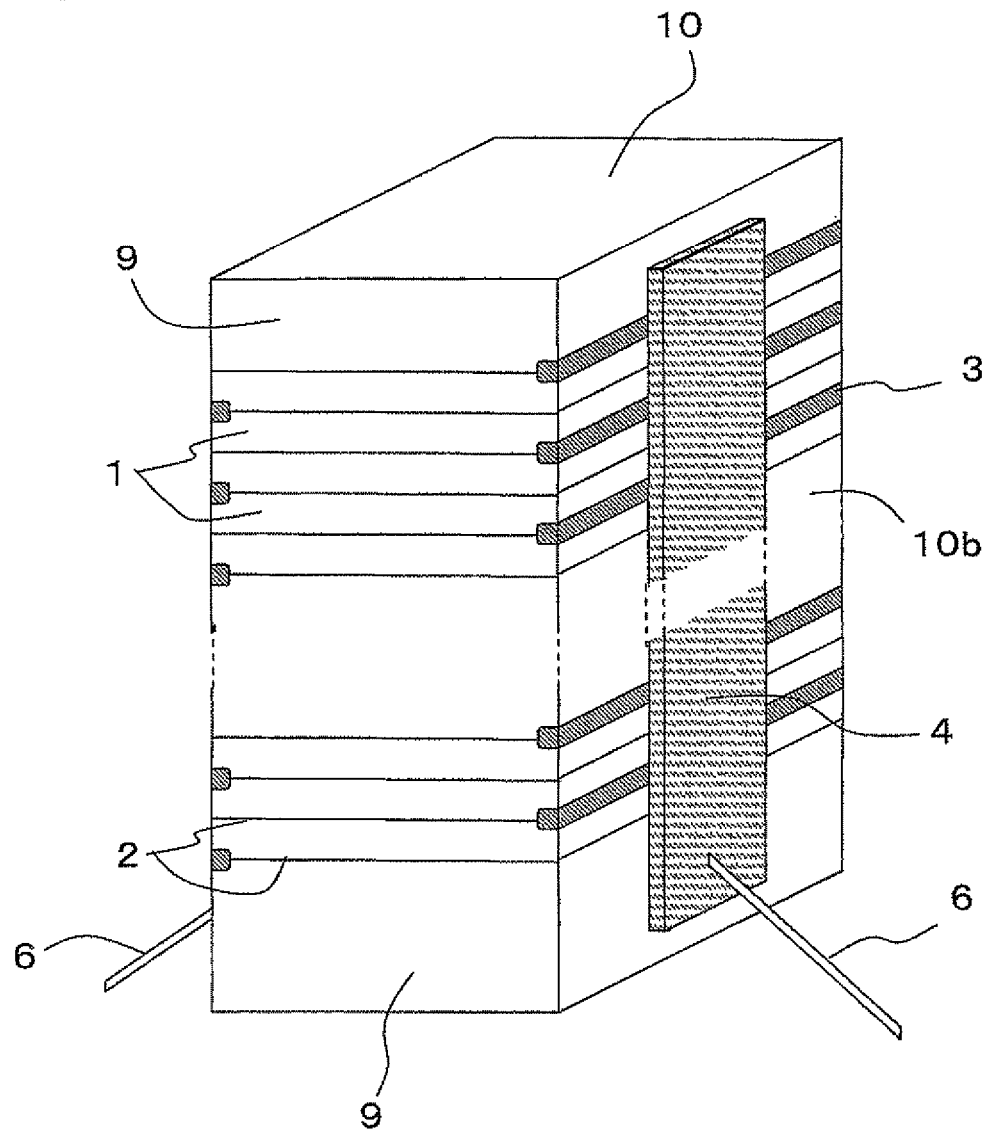
FIG. 1 is a perspective view showing the multi-layer piezoelectric component according to one embodiment of the present invention.

1: Dielectric material layer
2: Internal electrode
3: Insulating material
4: External electrode
6: Lead wire
8: Active section
9: Inactive section
9a: Inactive section on top surface
9b: Inactive section on bottom surface
10: Column-shaped stack
10a: Side face
10b: Side face

BEST MODE FOR CARRYING OUT THE INVENTION

First Embodiment

Now the multi-layer piezoelectric component according to the first embodiment of the present invention will be described in detail by making reference to the accompanying drawings. FIG. 1 is a perspective view showing the multi-layer piezoelectric component according to the first embodiment, FIG. 2 is a side view showing of the multi-layer piezoelectric component shown in FIG. 1, and FIG. 3 is a partially enlarged perspective view of a side face of the multi-layer piezoelectric component.

Figure 2:
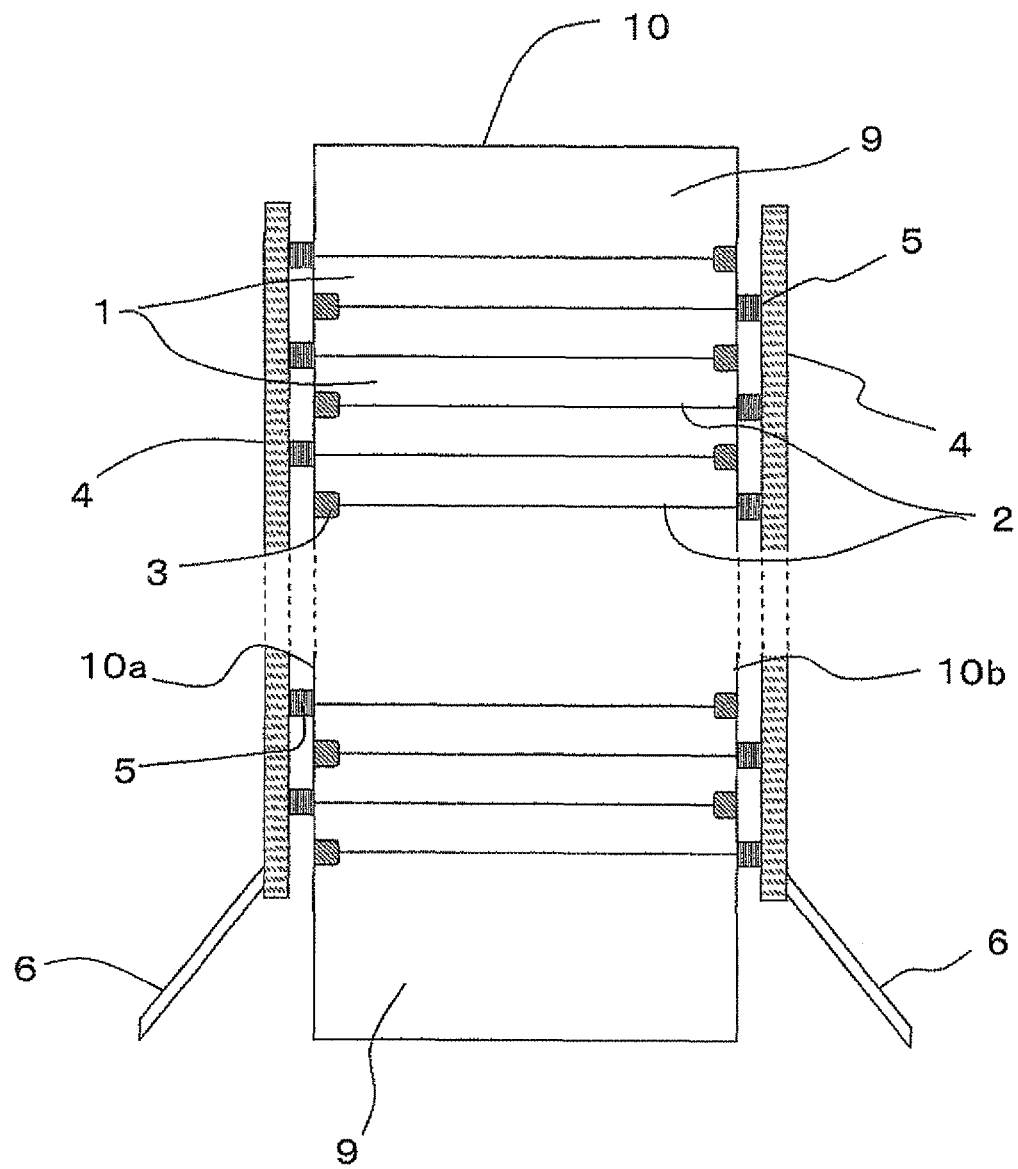
FIG. 2 is a side view showing of the multi-layer piezoelectric component shown in FIG. 1.
Figure 3:
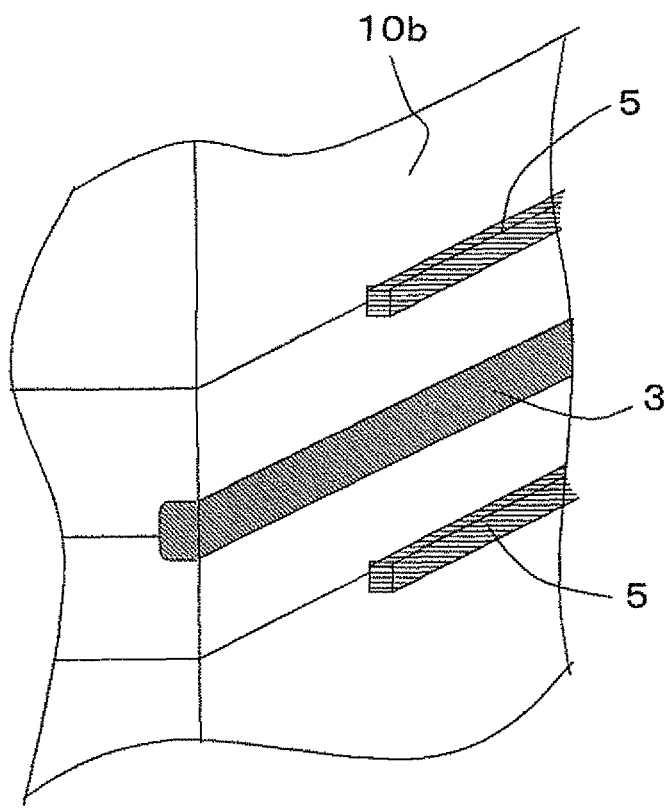
FIG. 3 is a partially enlarged perspective view of a side face of the multi-layer piezoelectric component shown in FIG. 1.

As shown in FIGS. 1 to 3, the multi-layer electronic component comprises a stack 10 having configuration of rectangular prism constituted from a plurality of dielectric material layers 1 and a plurality of internal electrodes 1 placed alternately one on another, and a pair of external electrodes 4 formed on the two opposing side faces 10a, 10b of the stack 10. In the stack 10, one end of each of the internal electrodes 2 is exposed on either of the side faces 10a, 10b and the other end of the internal electrode 2 is insulated by an insulating material 3 on the other end face. One end of the internal electrode 2 is exposed on either of the side faces 10a, 10b in one layer, and the other end of the internal electrode 2 is exposed on the other of the side faces 10a, 10b in the next layer. The ends (the portions not covered by the insulating material 3) of the internal electrode 2 exposed on the side faces 10a, 10b are connected to the external electrodes 4. In the first embodiment, grooves that reach the other end of the internal electrode 2 are formed on the side faces 10a, 10b. The grooves are filled with the insulating material 3 so as to provide insulation between the external electrodes 4. The external electrodes 4 are connected to lead wires 6. Inactive layers 9 are formed from a dielectric material on both ends of the stack 10 in the stacking direction thereof.

In the first embodiment, the internal electrodes 2 are formed from a metallic material such as silver-palladium alloy. The dielectric material layer 1 is formed from a piezo-electric ceramics or the like. It is particularly preferable to use a piezoelectric ceramic material that includes lead titanate zirconate ($Pb(Zr—Ti)O_3$: hereinafter abbreviated as PZT) as the main component, since it has a high value of piezoelectric strain constant $d_{33}$ which represents the piezoelectric characteristic. The dielectric material layer 1 is interposed between two internal electrodes 2. A displacement in the dielectric material layer 1 can be caused by reverse piezoelectric effect by applying a predetermined voltage across the dielectric material layer 1 via the lead wires 6.

The dielectric material layer 1 preferably has dimension of 50 to 250 μm in thickness, namely the distance between the internal electrodes 2. It is convenient to increase the numbers of the dielectric material layer 1 and the internal electrodes 2 that are stacked one on another, for increasing the piezoelectric effect and the reverse piezoelectric effect. In order to keep the resultant device compact and low-profile when the number of stacked layers is increased, however, thickness of the dielectric material layers 1 should be decreased. To prevent insulation breakdown, on the other hand, thickness of the dielectric material layers 1 should be increased. Accordingly, thickness of the dielectric material layers 1 is preferably controlled within the range described above.

The multi-layer electronic component of the first embodiment is made possible to be repetitively operated under high voltage, high temperature and high humidity in case lead is included within the crystal grains of the dielectric material layers 1 formed from the piezoelectric material as described above, by (1) restricting the number of grains of lead compound that are larger than a predetermined size present in the crystal grain boundaries of the dielectric material layer 1; or (2) controlling the amount of lead compound that remains in the crystal grain boundaries in the dielectric material layer 1.

Specifically, in case grain size of the lead compound that remains in the crystal grain boundaries of the dielectric material layers 1 is restricted, the number of grains of lead compound not smaller than 0.01 μm per 100 $μm^2$ of observation area is restricted to 2 or less and, when the number is counted in two or more observation areas, the number of grains larger than 0.01 μm per 100 $μm^2$ of observation area is restricted to 2 or less, or zero on average.

Presence of lead compound that remains in the crystal grain boundaries decreases the Curie point of the dielectric material in the vicinity of the lead compound, leading to localized phase transition at a lower temperature. This results in lower strength at these points that may decrease the strength of the entire stack at higher temperatures. Lead compound grains smaller than 0.01 μm, should they be present in the crystal grain boundaries, hardly affect the Curie point of the dielectric material in the vicinity of the lead compound. Therefore, the effect of the present invention can be achieved by controlling the number of grains of lead compound not smaller than 0.01 μm present in the crystal grain boundaries of the dielectric material layer 1 as described above. The term "lead compound" herein includes metal lead, lead oxide, lead titanate, lead zirconate, etc.

The present invention has been completed as the inventor found the fact that phase transition tends to occur when the number of grains of lead compound not smaller than 0.01 μm per 100 $μm^2$ of observation area exceeds 2 in the crystal grain boundaries, thus increasing the localized regions of lower strength and decreasing the strength of the stack at high temperatures. The inventor also found that the effect of the present invention is more conspicuous in the multi-layer electronic component, based on the finding that possibility of reaction between the electrode component and lead is higher in the multi-layer electronic component that has more electrode components than in a single-layer device, and therefore the lead components have higher tendency of remaining in the grain boundaries. The reason for the higher tendency of the lead components to remain in the grain boundaries in the multi-layer electronic component is supposedly that lead that has reacted with the electrode component is more likely to be fixed in the grain boundaries than lead in the state of element, and is therefore less likely to form solid solution with the dielectric material or be purged to the outside. In the multi-layer electronic component, presence of the residual lead component in the grain boundaries may decrease the bonding strength in the interface of stacking.

In the first embodiment, the number of lead compound grains that remain in the crystal grain boundaries in the dielectric material layer may be counted, for example, as follows. A flat sheet about 1 mm in thickness is cut out of a column-shaped stack that constitutes the multi-layer electronic component, and is polished with sand paper or the like to decrease the thickness to about 100 μm. Thickness of the sheet is further decreased to several tens of nanometers by Ar ion etching or the like, and this thinned sheet is observed under a transmission electron microscope (TEM), with such a power of magnification that an observation area of 100 $μm^2$ can be seen within the scope. Then the number of grains of the lead compound not smaller than 0.01 μm per 100 $μm^2$ of observation area is mounted. The samples used in this evaluation are preferably taken from a plurality of places of the column-shaped stack. In each sample, too, it is preferable to count the lead compound grains in the procedure described above in a plurality of observation areas selected in the sheet. In case count is taken in a plurality of observation areas, mean value of the counts should be 2 or less. In the present invention, size of the lead compound grain refers to the largest size of a grain observed.

The multi-layer electronic component of the first embodiment is made possible to be repetitively operated under high voltage, high temperature and high humidity, by controlling the amount of lead compound that remains in the crystal grain boundaries in the dielectric material layer 1.

Specifically, when the dielectric material layer is dissolved in acetic acid, concentration of lead that has eluted from the lead compound, in the acetic acid is not higher than 100 times the concentration of Zr that has eluted from the lead compound, in the acetic acid.

That is, in the multi-layer electronic component of the present invention, the amount of lead compound that remains in the crystal grain boundaries is controlled so that, when at least a part of the dielectric material layer is dissolved in acetic acid, proportion Pb/Zr of lead and zirconia in weight is not higher than 100. The proportion Pb/Zr of lead and zirconia in weight is preferably 50 or less, more preferably 30 or less, and further more preferably 20 or less and most preferably 10 or less.

The amount of lead compound that remains in the crystal grain boundaries in the dielectric material layer 1 can be evaluated by the procedure described above because the lead compound that remains in the crystal grain boundaries in the dielectric material layer 1 dissolves more easily even in a weak acid than lead compound that remains in the crystal grain boundaries. In case much of the lead compound remains in the crystal grain boundaries, more lead is dissolved in acetic acid, thus giving the indication of the lead compound that remains in the crystal grain boundaries. As mentioned previously, presence of the lead compound that remains in the crystal grain boundaries in the dielectric material layer may lead to a decrease in strength during operation at a high temperature.

The reason for controlling the amount of lead in proportion to zirconia is as follows. Since lead component exists also within the crystal grains, the lead dissolved in acetic acid includes lead coming from within the crystal grains, albeit in a small amount. By comparing with the amount of zirconia that is another component included within the crystal grains, it is made possible to evaluate the amount of lead dissolved from other than the crystal grains, namely from the crystal grain boundaries.

Value of the proportion of lead and zirconia in weight higher than 100 means that much lead compound remains in the crystal grain boundaries, leading to phase transition and increasing the localized regions of lower strength and decreasing the strength of the stack at high temperatures. When the proportion of Pb/Zr in weight is 50 or less, the dielectric material layer 1 includes less lead compound that remains in the crystal grain boundaries, and shows higher strength at high temperatures.

In the first embodiment, the proportion of lead and zirconia in weight can be evaluated as follows. A part of the stack is cut off and polished into mirror finish by using a diamond paste or the like. After immersing the sample in a 50% acetic acid solution of 90° C. for 60 minutes, materials dissolved in the acetic acid is analyzed by induction-coupled plasma mass spectroscopy (ICP-MS), thereby determining the proportion of Pb/Zr in weight. The "part of the stack" described above to prepare the sample for determining the proportion of Pb/Zr in weight may be any part that includes the dielectric material layer, and may include the internal electrode as well as the dielectric material. There is no restriction on the surface that is finished to mirror finish, which may be any surface whereon the crystal grain boundary of the dielectric material is exposed.

Mean crystal grain size in the dielectric material layer 1 is 1 µm or larger, preferably 1.5 µm or larger and more preferably 2.0 µm or larger. When mean crystal grain size is 1 µm or larger, in addition to the decrease of the grain boundaries, presence of lead compound in the grain boundaries is diminished as impurities including the lead compound is purged from the grain boundaries to the outside of the stack or taken into the crystal grains in the process of growth of the crystal grains. In contrast, when mean crystal grain size is smaller than 1 µm, lead compound tends to remain in the crystal grain boundaries, giving rise to the possibility of decreasing strength at high temperatures. It is preferable that upper limit of the mean crystal grain size is 5 µm or smaller, preferably 4 µm or smaller and more preferably 3.5 µm or smaller. In contrast, when the crystal grains are larger than 5 µm, defects become larger and therefore strength of the ceramics may become lower. Therefore, it is preferable that mean crystal grain size is within a range from 1 µm to 5 µm, preferably from 1.5 µm to 4 µm, and more preferably from 2.0 µm to 3.5 µm.

Mean grain size of crystal of the dielectric material layer 1 can be determined by observing a section of the dielectric material layer 1 with, for example, a scanning electron microscope (SEM), counting the number of grains that lie on an arbitrarily drawn line segment and dividing the length of the line segment by the number of grains.

Moreover, according to the present invention, silver content in the dielectric material layer 1 is 0.5% by weight or less, preferably 0.3% by weight or less and more preferably 0.1% by weight or less. While the dielectric material layer 1 includes such components that diffuse from the internal electrode 2, silver included with a concentration of higher than 0.5% by weight tends to react with lead. Lead compound generated by reaction with silver tends to decrease the Curie point. Therefore, silver content in the dielectric material layer 1 is preferably 0.5% by weight or less. In case silver is used in the internal electrode, presence of lead component in the grain boundaries may result in migration of silver induced by lead which may deteriorate the insulation performance of the dielectric material layers 1. Thus decreasing the lead content in the crystal grain boundaries to an extremely low level or zero as in the present invention also has an effect of improving the electrical insulation.

Junction between the external electrodes and the internal electrodes in the first embodiment is constituted as described below.

The internal electrodes 2 are exposed on the four side faces of the column-shaped stack 10 that has been fired. On at least one of the side faces, groove measuring 50 to 500 µm in depth and 30 to 200 µm in width in the stacking direction is formed in every other layer on the end face of the dielectric material layer 1 that includes the end of the internal electrode 2. The groove is filled with the insulating material 3. The insulating material 3 is formed from glass, an epoxy resin, a polyimide resin, a polyamidimide resin, a silicone rubber or the like. The insulating material 3 increases bonding with the column-shaped stack 10, and is therefore preferably formed from a material that has low modulus of elasticity capable of accommodating the displacement of the column-shaped stack 10, such as silicone rubber. The insulating material 3 insulates the internal electrodes 2 at one end in every other layer on the opposing two side faces 10b of the column-shaped stack 10, while the other ends of the internal electrodes 2 which are not insulated are connected to the external electrodes 4.

The external electrodes 4 are formed from a metallic material having high electrical conductivity and high elasticity such as Ag, Ni, Cu, Al, W, Mo, stainless steel and Fe—Ni—Co alloy. Among these, it is preferable to use Ag, Ni or stainless steel because of sufficient resistance against oxidization and high electrical conductivity. In order to render the external electrodes 4 low electrical resistance and elasticity so as to be capable of accommodating the displacement of the column-shaped stack 10, it is preferable to provide a mesh member in a portion of joining with the inner electrode 2 and set the thickness of the external electrode 4 to about 50 to 500 µm.

The external electrodes 4 may be connected to the inner electrode 2 while being pressed (for example, pinched by a clip or the like) against the opposing two side faces 10b of the column-shaped stack 10 by an external holding force (for example, pinched by a clip or the like). Alternatively, the external electrodes 4 may be connected to the inner electrode 2 by soldering or the like, or by forming a thin film of low electrical resistance on the opposing two side faces 10b of the column-shaped stack 10 by vapor deposition, sputtering, plating or the like and connecting the external electrode 4 on the low electrical resistance film.

Moreover, the lead wires 6 are connected to the external electrodes 5 by soldering or the like. The lead wires 6 serve to connect the external electrodes 4 to a power source provided externally. DC voltage of 0.1 to 3 kV/ram is applied across the pair of external electrodes 4 via the lead wires 6 so as to apply polarization treatment to the column-shaped stack 10, thereby to complete the piezoelectric component. As the lead wires 6 are connected to the external power source to supply a voltage via the external electrodes 4 to the internal electrodes 2, the dielectric material layers 1 undergo significant displacement due to reverse piezoelectric effect.

Second Embodiment

The multi-layer electronic component according to the second embodiment of the present invention comprises the active section constituted from a plurality of dielectric material layers including lead and a plurality of internal electrodes which are stacked alternately one on another and the upper inactive section and the lower inactive section formed from the dielectric material layers on the top surface and the lower surface, respectively, of the active section in the stacking direction thereof, having the following constitution.

In the multi-layer electronic component of the second embodiment, dielectric constant $\in 1$ of a dielectric material layer disposed between the uppermost inner electrode that is disposed at the top among the internal electrodes and an internal electrode located next to the uppermost inner electrode, dielectric constant $\in 2$ of a dielectric material layer disposed between the lowermost inner electrode that is disposed at the bottom among the internal electrodes and a second lower internal electrode located next to the lowermost inner electrode and dielectric constant $\in 3$ of a dielectric material layer disposed between two adjacent internal electrodes in the vicinity of the center of the active stack satisfy relationships of $\in 1 > \in 3$ and $\in 2 > \in 3$.

When dielectric constant of the active section is set higher in the vicinity of the inactive section in this way, polarization becomes less likely to proceed in the vicinity of the inactive section, thus it is made possible to decrease the amount of expansion of this section under the same voltage applied thereto, and reduce the stress. In a multi-layer electronic component that includes active layer that expands or contracts when a voltage is applied and inactive section that does not expand or contract, significant stress is generated in the interface between the active layer and the inactive section. However, in the constitution of the third embodiment, expansion in the vicinity of the inactive section is suppressed by setting the dielectric constant in the vicinity of the inactive section, and therefore stress can be mitigated.

As a result, the multi-layer electronic component of the second embodiment demonstrates higher reliability when repetitively operated under high voltage, high temperature and high humidity.

It is preferable that the multi-layer electronic component of the second embodiment further includes a plurality of dielectric material layers of which dielectric constant decreases gradually from $\in 1$ to $\in 3$ provided on the surface lower than the dielectric material layer that is disposed between the uppermost inner electrode and the internal electrode located next to the uppermost inner electrode.

It is also preferable that the multi-layer electronic component includes a plurality of dielectric material layers of which dielectric constant decreases gradually from $\in 2$ to $\in 3$ provided on the surface upper than the dielectric material layer that is disposed between the lowermost inner electrode and the internal electrode located next to the lowermost inner electrode. Stress can be decreased by providing the plurality of dielectric material layers having dielectric constant decreasing gradually at position above or below the central region, or preferably above an below the central portion. In this case, it is more preferable to form the internal electrodes from a material that includes silver as the main component, which enables it to decrease the firing temperature and form the section where dielectric constant of the dielectric material layers decreases gradually, Now method for manufacturing the multi-layer electronic component of the first and second embodiments will be described.

The multi-layer electronic components of the first and second embodiments are manufactured as follows. First, calcined powder of a piezoelectric ceramic material such as PZT, a binder made of an organic polymer such as an acrylic resin or a butyral resin and a plasticizer such as DBP (dibutyl phthalate) or DOP (dioctyl phthalate) are mixed to form a slurry. The slurry is formed into ceramic green sheets that would become the dielectric material layers 1 by a known method such as doctor blade process or calender roll process, slip casting process or other tape molding method.

Then silver-palladium alloy powder, a binder, a plasticizer and the calcined powder of the piezoelectric ceramic material, as required, are mixed to prepare an electrically conductive paste, that would form the internal electrode 2. The electrically conductive paste is applied onto the top surfaces of the ceramic green sheets by screen printing method or the like to a thickness from 1 to 40 μm.

Then the ceramic green sheets having the electrically conductive paste printed thereon are stacked one on another, and cut to a predetermined size. The stack is heated at a predetermined temperature to remove the binder, and is then fired at a temperature in a range from 700 to 1,400° C. thereby to make the column-shaped stack 10.

The multi-layer electronic components of the first and second embodiments are manufactured by firing the stack in two steps of the first firing step and the second firing step in the firing process of the manufacturing method of the present invention. The second firing step is carried out under such conditions as a firing temperature higher than that of the first firing step, firing atmosphere having a pressure that is equal to or lower than that of the first firing step and concentration of lead in the firing atmosphere that is equal to or lower than that of the first firing step.

Specifically, firing temperature is set in a range from 700 to 1,400° C. thereby, preferably from 800 to 1,300° C., and more preferably from 850 to 1,200° C. in both the first firing step and the second firing step. At this time, the firing temperature in the second firing step is set 10° C. or more, preferably 30° C. or more, and more preferably 50° C. or more higher than that in the first step.

Pressure of the firing atmosphere and concentration of lead in the firing atmosphere are controlled such that pressure of the firing atmosphere is kept high by closing the crucible airtight so as to pressurize with the lead-containing vapor produced from the green sheets in the first firing step, and the crucible is opened to keep the pressure and concentration of lead in the firing atmosphere from increasing. Duration of firing is set from 1 to 20 hours in both the first firing step and the second firing step, preferably from 2 to 10 hours, and preferably from 3 to 6 hours when economy is taken into consideration.

The first firing step and the second firing step may be carried out separately in a batch furnace or the like. However, for the purpose of mass production, it is preferable to carry out the firing steps continuously by employing temperature profile and air inlet tube in a continuous furnace such as tunnel furnace.

In case firing is carried out in two separate steps in a batch furnace, it is preferable that the second firing step is carried out under such conditions as a firing temperature higher than that of the first firing step, firing atmosphere having a pressure that is lower than that of the first firing step and concentration of lead in the firing atmosphere that is lower than that of the first firing step. The reason is as described below.

Presence of lead in the ceramics used as the dielectric material promotes the generation of liquid phase that increases the density of the ceramics. Generation of liquid phase is promoted supposedly because compounds of lead that in general have low melting points are formed from reaction of the ceramic components and lead, thereby producing liquid phase of the lead compound. Accordingly, the firing temperature is set low, concentration of lead in the firing atmosphere is kept high and pressure is increased in the first firing step, so as to increase the density. In order to achieve a sufficiently high density and stable piezoelectric characteristic, it is preferable to fire the stack until the relative density of the dielectric material layer reaches 80 to 99%, preferably 85 to 95% and more preferably 90 to 95%, and then carry out the second firing step.

It is necessary to increase the relative density to a certain level in the first firing step as described above, because the lead component can easily decompose in the second firing step thus making it difficult to increase the density. However, while a dense sintered material is obtained in the first firing step, the components that formed the liquid phase tend to remain in the crystal boundaries in this stage. As a result, strength of a stack produced by firing only in the first firing step decreases during operation at high temperatures. In a multi-layer electronic component that includes much components of the internal electrode such as silver, in particular, the components of the electrode tend to diffuse and remain in the crystal grain boundaries.

Therefore in the second firing step, it is necessary to remove the components that include lead and generate the liquid phase so as to remain in the grain boundaries. Specifically, the second firing step is carried out under such conditions as a firing temperature higher, a pressure in the crucible lower and a concentration of lead lower than those of the first firing step. This facilitates the removal of lead components, so that less lead compounds remain in the grain boundaries in the end and the aim of producing a dielectric material having high strength at high temperatures can be achieved.

The firing scheme described above is also effective in purging excessive lead component. Moreover, in the stack having the inactive sections on both sides of the active section, lead concentration in a portion of the active section in the vicinity of the inactive section becomes lower than that in a central region of the active section, due to the supply of lead from the inactive section. As a result, the portion of the active section in the vicinity of the inactive section has a little higher rate of site A/site B in the perovskite structure and a higher dielectric constant than in the central region of the active section. Since this results in less expansion during polarization treatment, such a multi-layer electronic component can be made as the stress generated in the portion of the active section in the vicinity of the inactive section can be reduced as described in the second embodiment.

In addition, the central region of the active section has higher concentration of the internal electrodes formed from silver or the like that tends to form the liquid phase, than the vicinity of the inactive section. Therefore the firing scheme described above is effective in causing the liquid phase to be formed at lower temperatures in the early stage of firing in the central portion of the active section than in the vicinity of the inactive section, thereby making it easier for the lead component included in the liquid phase to move.

Lead has a low evaporation temperature and therefore evaporates from the surface of the stack at the highest temperature during the firing process, to be purged from the grain boundaries of the stack. As a result, more lead evaporates in the central portion of the active section where the liquid phase is formed than in the inactive section. Thus the lead components that constitute the site A of the perovskite structure can be made less than in the vicinity of the inactive section, resulting in a higher dielectric constant in the vicinity of the inactive section than in the central portion of the active section. This makes the vicinity of the inactive section less susceptible to polarization and less likely to expand than the central portion of the active section. As a result, layers that undergo less displacement than the central portion of the active section cam be formed between the active section and the inactive section, thereby mitigating the stress generated between the active section and the inactive section.

Figure 4:
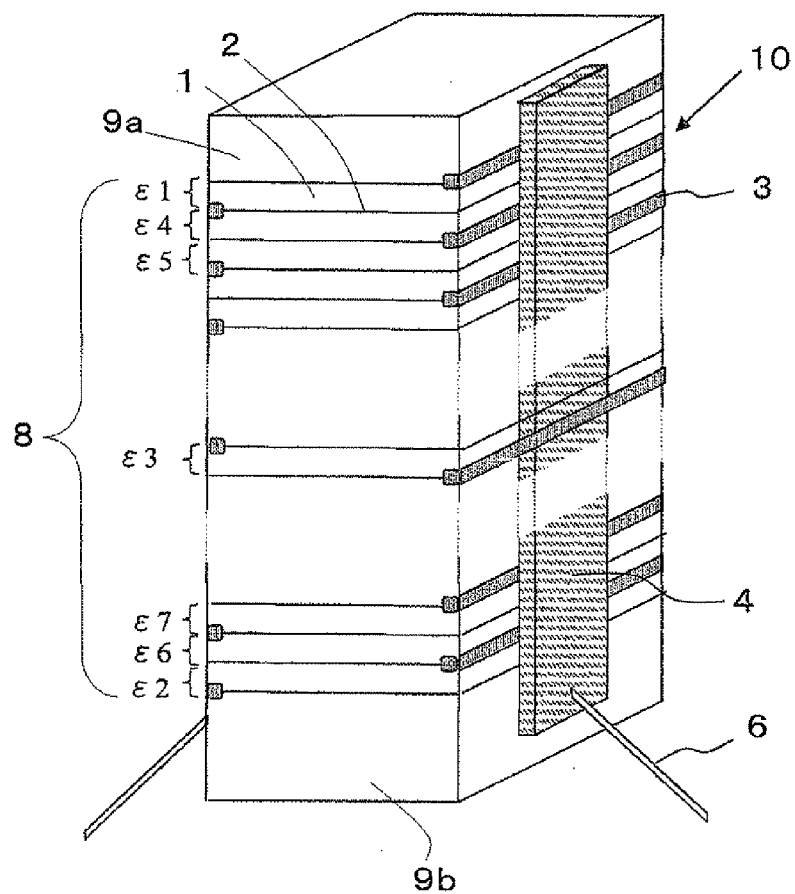
FIG. 4 is a perspective view of a portion of the multi-layer piezoelectric component shown in FIG. 1 where dielectric constant was measured.

Thus the manufacturing method described above, as shown in FIG. 4, makes it possible to manufacture the multi-layer electronic component that has a region where the dielectric constant ($\in 1$) of the dielectric material layer that is disposed between the uppermost inner electrode located at the top and the internal electrode located next to the uppermost inner electrode and dielectric constant ($\in 4, \in 5 \ldots$) of the dielectric material layers that are disposed below the former dielectric layer and/or the dielectric constant ($\in 2$) of the dielectric material layer that is disposed between the lowermost inner electrode located at the bottom and the internal electrode located next to the lowermost inner electrode and dielectric constant ($\in 6, \in 7 \ldots$) of the dielectric material layers that are disposed above the former dielectric layer decreases gradually toward the dielectric constant ($\in 3$) of the dielectric material layer that is disposed between two adjacent internal electrodes in the vicinity of the center of the active section 8. Thus the stress generated between the active section 8 and the inactive section 9 can be sufficiently reduced without changing the thickness of the dielectric material layers.

The manufacturing method of the present invention, as described above, makes it possible to adjust the lead concentration in the firing atmosphere by means of the opening provided in the crucible used to fire the dielectric material layers and the internal electrodes. The opening, that may be provided at any part of the crucible, can be provided by boring a hole in the crucible or placing a spacer on the lid. Vapor including lead generated through decomposition of the stack is allowed to escape through the opening, so as to prevent the pressure from becoming unusually high and the lead concentration from increasing in the atmosphere.

It is made possible to adjust the lead concentration in the firing atmosphere also by placing a material that absorbs lead in or by the crucible. $Al_2O_3$, $ZrO_2$ or $MgO$ is preferably used as the material that absorbs lead. These materials have high tendency to react with lead, and are capable of absorbing the excessive lead components that have been generated through decomposition of the fired stack and purged. While these material may be used either in the form of raw material or sintered material, it is preferable to use in the form of sintered material since the raw material reacts too vigorously.

In addition, in the second firing step, it is also preferable that the inner pressure of the crucible is approximately equal to the outside pressure. This is because too large an opening or excessive amount of the absorbing material with the inner pressure becoming too low may cause excessive precipitation of the lead components through decomposition of the sintered material that has been sintered, leading to a failure to achieve the required piezoelectric characteristic.

According to the manufacturing method of the present invention, change in the weight before and after firing can be used as an indication to see whether the firing temperature, pressure and concentration of lead in the first firing step and in the second firing step are set in proper ranges. According to the present invention, change in the weight before and after firing (weight loss) is in a range from 0.1 to 3%, preferably from 0.5 to 2% and more preferably from 1 to 1.5%. Change in the weight less than 0.1% indicates that purging of the lead component is insufficient, and there is a possibility of many grains of lead compound having grain size of 0.01 μm or larger to remain in the crystal grain boundaries resulting in insufficient insulation. In contrast, when change in weight is more than 3%, composition of the dielectric material layers may deviate from the desired range, leading to a failure to achieve the required characteristic.

In case the firing process is carried out in a continuous furnace, it is preferable to carry out the second firing step under such conditions as a firing temperature higher than that of the first firing step, firing atmosphere having a pressure that is substantially equal to that of the first firing step and concentration of lead that is substantially equal to that of the first firing step. When the firing process is carried out in a continuous furnace, similar levels of lead concentration and pressure can be maintained in the first firing step and in the second firing step by using a crucible having an opening adjusted to an appropriate size. This also results in such a state as the firing atmosphere includes a necessary level of lead content for firing in the first firing step, and the firing atmosphere does not include excessive level of lead content in the second firing step, thereby making it possible to obtain a desired product. Change in the weight before and after firing can be used as an indication to see whether the firing conditions are properly set or not in a continuous furnace. The opening of the crucible may be adjusted so as to control the change in weight within the range described above.

Third Embodiment

The multi-layer electronic component according to the third embodiment of the present invention comprises a stack 10 having configuration of rectangular prism constituted from a plurality of dielectric material layers 1 and a plurality of internal electrodes 2 placed alternately one on another, and a pair of external electrodes 4 formed on the two opposing side faces 10a, 10b of the stack 10, wherein compound of group 2 element is precipitated in the crystal grain boundaries of the dielectric material layers that are exposed on the surface. The internal electrodes, the external electrodes and the structure of connection thereof in the multi-layer electronic component of the third embodiment are similar to those of the first embodiment.

When the compound of group 2 element that has high humidity resistance is precipitated on the surface, moisture can be prevented from infiltrating into the ceramics, thus improving the humidity resistance of the multi-layer electronic component. In particular, among the group 2 elements, it is preferable to have precipitation on the surface of compounds of alkaline earth metal elements (Ca, Sr, Ba, Ra) that can effectively improve the humidity resistance. It is more preferable to have precipitation of compounds of barium (Ba) or strontium (Sr) that has higher tendency of substituting lead to form solid solution and precipitating.

The group 2 elements are Be, Mg, Ca, Sr, Ba and Ra.

The compound of group 2 element to be precipitated in the crystal grain boundaries on the surface is preferably a compound that includes ion of group 2 element that is capable of forming a solid solution at site A of the composition $ABO_3$ of the perovskite structure. Such an ion of group 2 element has higher tendency of substituting lead that constitutes the dielectric material to form solid solution and precipitating on the surface, and is further capable of improving the bonding strength between the precipitated compound and the ceramics. The compound of group 2 element is preferably an amorphous material that does not show anisotropy in the properties and has high strength against stress in a particular direction.

The compound of group 2 element is also preferably precipitated in the vicinity of the internal electrodes where the largest displacement occurs and high stress is experienced on the side face of the multi-layer electronic component. It is preferable that particle size of the compound of group 2 element that is precipitated is smaller than the crystal grain size of the dielectric material layer on the surface of the multi-layer electronic component, in order to increase the density and increase the bonding strength. It is also preferable that the dielectric material layer includes, as a main component, lead titanate zirconate that has high tendency to form a solid solution with the compound of group 2 element and precipitating, and is therefore capable of improving the humidity resistance.

In the multi-layer electronic component of the third embodiment, grain size of the lead compound that remains in the crystal grain boundaries of the dielectric material layers 1 or the amount of the lead compound that remains in the crystal grain boundaries of the dielectric material layers 1 may be restricted similarly to the first embodiment, so as to provide the multi-layer electronic component having better humidity resistance than the multi-layer electronic component of the first embodiment, capable of repetitively operating under high voltage, high temperature and high humidity.

Now a method of manufacturing the multi-layer electronic component according to the third embodiment will be described. The manufacturing method of the third embodiment is capable of causing the compound of group 2 element to precipitate on the side face of the multi-layer electronic component.

The method of manufacturing the multi-layer electronic component according to the third embodiment, that comprises a plurality of dielectric material layers which include lead and a plurality of internal electrodes stacked alternately one on another, comprises a step of preparing a green compact of stack by stacking a plurality of green compacts including a powder of dielectric material that includes lead and a plurality of internal electrodes formed mainly from a metallic material, the first firing step of firing the green compact of stack in an atmosphere including lead in the crucible and the second firing step of firing the green compact of stack in an atmosphere including lead of lower concentration at a temperature higher than in the first firing step, wherein liquid phase including lead is generated in the grain boundaries of the dielectric material and the metallic material in the first firing step, and lead in the liquid phase is purged out of the stack in the second firing step. By including lead in the liquid phase, the material can be caused to undergo more satisfactory sintering process, and excessive lead component can be purged more easily to the outside. Specifically, in the molding process, group 2 element is added to a powder of dielectric material including lead, group 2 element is included in the liquid phase in the first firing step, and compound of the group 2 element is precipitated on the surface of the stack. By adding the compound of the group 2 element and causing it to precipitate to the outside during firing, it is made possible to have tiny particles of the compound of the group 2 element precipitated on the surface and improve the humidity resistance.

While the column-shaped stack made by this manufacturing method can demonstrate the humidity resistance since the compound of the group 2 element is precipitated on the surface thereof if it retains the shape as fired, the shape may be trimmed by grinding on a plane grinder or the like. Besides plane grinder, rotary grinder or dual-head grinder may also be used. Moreover, after the grinding process, or instead of grinding, the stack may be polished such as lapping with abrasive particles of silicon carbide or alumina. Fineness of the abrasive particles is preferably from #1,000 to #3,000. While the compound of group 2 element that has been precipitated is removed by grinding, the compound of group 2 element can be precipitated again by applying heat treatment at a temperature of 800° C. or higher after the grinding process, thereby to achieve the similar effect.

The process described above completes the column-shaped stack 10 constituted from a plurality of dielectric material layers 1 and a plurality of internal electrodes 2 stacked alternately one on another. Then the internal electrodes 2 is insulated by the insulating material 3 at one end thereof in every other layer on the opposing two side faces 10$b$ of the column-shaped stack 10, and the other ends of the internal electrodes which are not insulated are connected to the external electrodes 4, with the external electrodes 4 being connected to the lead wires 6, thereby completing the multi-layer electronic component of the present invention.

Injection Apparatus

Figure 5:
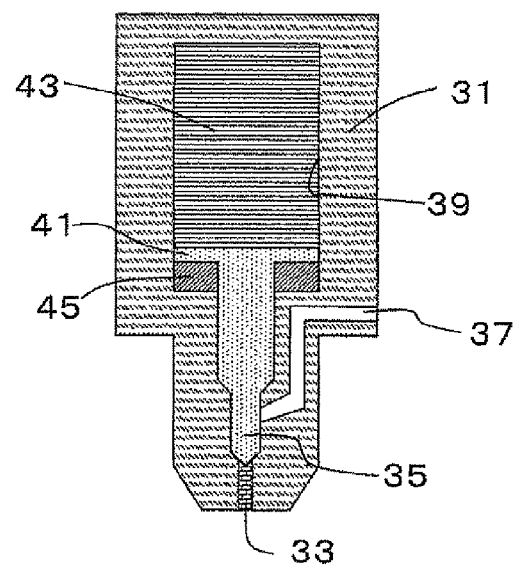
FIG. 5 is a sectional view showing an injection apparatus according to one embodiment of the present invention.

FIG. 5 is a schematic sectional view of an injection apparatus according one embodiment of the present invention. As shown in FIG. 5, the injection apparatus of this embodiment has the multi-layer electronic component of the present invention represented by the embodiments described above in a container 31 that has an injection hole 33 formed at one end thereof. The container 31 includes a needle valve 35 capable of opening and closing the injection hole 33 disposed therein. The injection hole 33 is connected to a fuel passage 37 that is capable of communicating therewith in response to the motion of the needle valve 35. The fuel passage 37 is connected to a fuel source provided outside, so that a fuel is supplied through the fuel passage 37 at a constant pressure that is always high. Accordingly, when the needle valve 35 opens the injection hole 33, the fuel supplied to the fuel passage 37 is injected at a high constant pressure into a fuel chamber of an internal engine which is not shown.

The needle valve 35 has an enlarged top portion of a larger inner diameter so as to provide a piston 41 that is capable of sliding in a cylinder 39 that is formed in the container 31. The piezoelectric actuator 43 having the multi-layer electronic component described above is housed in the container 31.

With the injection apparatus as described above, when the piezoelectric actuator 43 is caused to expand by applying a voltage thereto, the piston 41 is pressed so that the needle valve 35 plugs the injection hole 33 and shuts off the fuel supply. When the voltage is removed, the piezoelectric actuator 43 contracts and a Belleville spring 45 presses back the piston 41 so that the injection hole 33 communicates with the fuel passage 37 thereby allowing the fuel to be ejected.

The injection apparatus of the present invention may also be constituted from the container having the injection hole and the multi-layer electronic component, so that the liquid that fills the container is discharged through the injection hole by the operation of the multi-layer electronic component. That is, the device may not necessarily be inside of the container. The only requirement is that pressure is applied to the inside of the container by the operation of the multi-layer electronic component. In the present invention, the liquid includes fuel, ink and various other fluids such as electrically conductive paste.

The present invention relates to the multi-layer electronic component and the injection apparatus, although the present invention is not limited to the Examples described above. The present invention can be applied to various applications as, for example, fuel injection apparatus of automobile engine, liquid injection apparatus of ink jet printer or the like or a drive unit for precision positioning device or vibration preventing device for an optical apparatus, sensor element mounted in combustion pressure sensor, knocking sensor, acceleration sensor, load sensor, ultrasound sensor, pressure sensor, yaw rate sensor or the like, and circuit component mounted in piezoelectric gyro, piezoelectric switch, piezoelectric transducer, piezoelectric breaker or the like, and any other devices that utilize piezoelectric property, without departing the scope of the present invention.

Fuel Injection System

Figure 6:
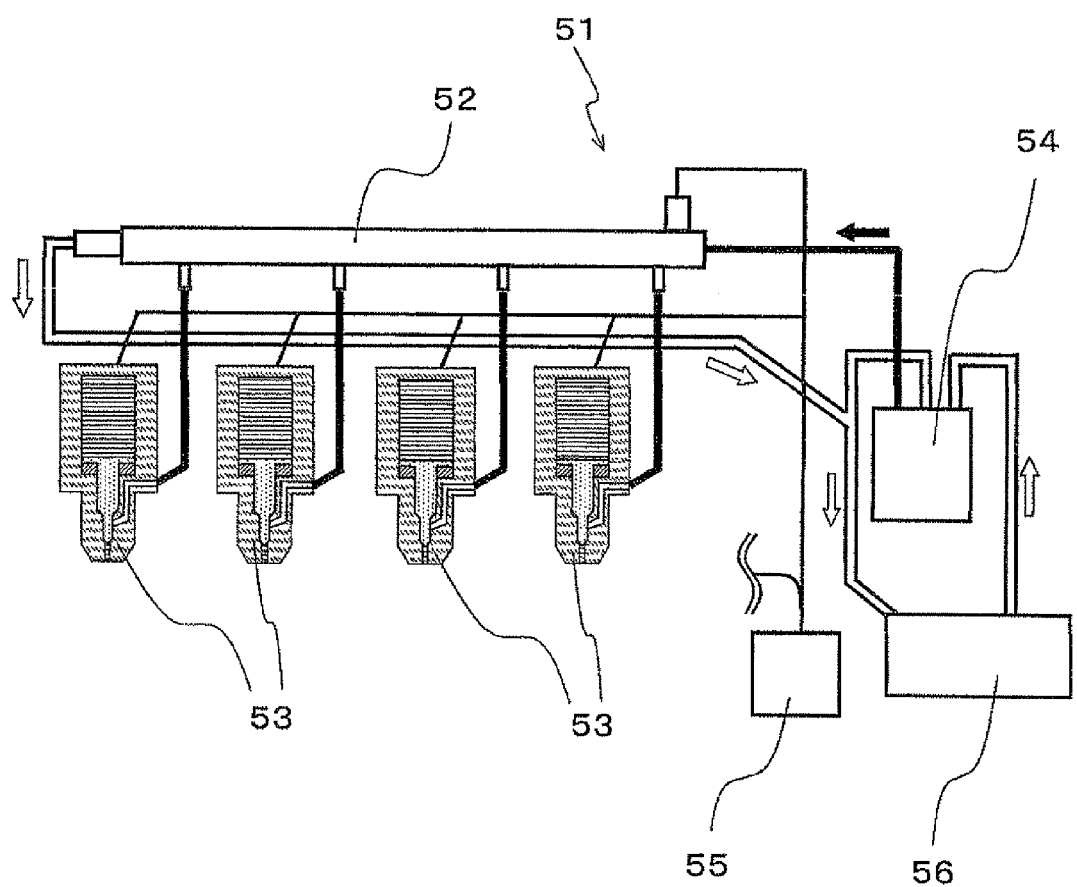
FIG. 6 is a schematic diagram showing a fuel injection system according to one embodiment of the present invention.

FIG. 6 is a schematic diagram showing the fuel injection system according to one embodiment of the present invention. As shown in FIG. 6, the fuel injection system 51 of this embodiment comprises a common rail 52 that stores a fuel, a plurality of the injection apparatus 53 that eject the fuel stored in the common rail 52, a pump 54 that supplies the fuel at a high pressure to the common rail 52 and an injection control unit 55 that sends a drive signal to the injection apparatus 53.

The injection control unit 55 controls the quantity of fuel to be injected and the timing of injection while monitoring the condition inside of the engine combustion chamber by means of sensor or the like. The pump 54 boosts the pressure of the fuel to a level from 1,000 to 2,000 atm, preferably from 1,500 to 1,700 atm, and supplies the fuel to the common rail 52 from a fuel tank 56. The common rail 52 stores the fuel supplied from the pump 54, and sends it to the injection apparatus 53 as required. The injection apparatus 53 injects a small amount of fuel through the injection hole 33 in the form of mist into the combustion chamber.

EXAMPLES

Example 1

In Example 1, first, a calcined powder of a piezoelectric ceramic material including PZT as the main component, a binder made of an organic polymer and a plasticizer were mixed to prepare a slurry. The slurry was formed into ceramic green sheets having thickness of 150 μm by slip casting method.

An electrically conductive paste was prepared by adding 30% by weight of the piezoelectric ceramic material for 100% by weight of a main component consisting of silver and palladium in proportions of 7 to 3. The electrically conductive paste was applied to one side of the green sheet by screen printing method to a thickness of 5 μm, and was dried. 300 green sheets coated with the electrically conductive paste were stacked one on another. The stack was sandwiched by the green sheets without the electrically conductive paste placed on both ends thereof in the stacking direction, 10 sheets on top and 20 sheets on bottom.

The stack was pressurized while heating to 100° C. so as to be integrated. The stack as then cut into a square prism measuring 8 mm by 8 mm, and was heated to 800° C. for 10 hours to remove the binder. The stack constituted from the dielectric material 1 and the internal electrodes 2 was then fired under the firing conditions shown in Table 1, to obtain the column-shaped stack 10 shown in FIG. 1. Change in weight was determined from the weight after the binder removing treatment and the weight after the firing.

The column-shaped stack 10 thus obtained was ground to a depth of 0.2 mm on four side faces and was chamfered to prepare the samples for evaluation. Breakage strength was measured by subjecting the sample to three-point bending test at 150° C.

In the actual product, grooves measuring 200 μm in depth and 75 μm in width in the stacking direction are formed in every other layer in a staggered configuration on the end face of the dielectric material layer 1 that includes the end of the internal electrode 2, on the two opposing side faces 10a, 10b of the multi-layer electronic component 10. The grooves are filled with silicone rubber to form the insulating material 3, and the ends of the internal electrodes 2 are exposed on the opposing two side faces 10a, 10b of the column-shaped stack 10.

Then an electrically conductive adhesive made of silver and polyimide resin was applied to the opposing two side faces 10a, 10b of the column-shaped stack 10, a mesh member was embedded in the electrically conductive adhesive, and was heated to 200° C. to cure, thereby forming the external electrodes 4.

Then the lead wires 6 were connected to the external electrodes 4 by soldering. After cleaning the periphery of the multi-layer electronic component with alcohol or the like, the surface was treated by using a primer to improve the bonding property of the resin. Then after coating with silicone rubber by dipping or the like, a voltage of 1 kV was applied to carry out polarization treatment of the entire multi-layer electronic component, thereby to obtain the multi-layer electronic component of the present invention shown in FIG. 1.

When a DC voltage of 200 V was applied to the multi-layer electronic component, the multi-layer electronic component underwent displacement of 30 μm.

The amount of lead compound that remains in the crystal grain boundaries in the dielectric material layer and the proportion of lead and zirconia in weight were measured as follows.

A flat sheet about 1 mm in thickness was cut out of the sintered material, and was polished with sand paper of #3,000 to decrease the thickness and prepare a sample for TEM observation. Grain size and quantity of lead compound that remains in the crystal grain boundaries were determined by measuring at five points in an observation area of 100 μm² (10 μm square) while observing under a TEM. Table 1 shows the average of the measurements at the five points. Amount of Pb compound in Table 1 represents the number of lead compound grains not smaller than 0.01 μm. Grain size herein means the largest size of the grain of lead compound.

A flat plate 5 mm in thickness was cut off the sintered material and was polished on the top and bottom surfaces thereof by using a diamond paste of #3,000. After immersing the flat plate in a 50% acetic acid solution of 90° C. for 60 minutes, the flat plate was removed from the solution and materials dissolved in the acetic acid was analyzed by means of ICP-MS apparatus, thereby determining proportions of Pb and Zr in weight.

Results of the tests are shown in Table 1.

Example 2

Sample of column-shaped stack made similarly to the Example 1 was fired with the material shown in Table 2 placed around the column-shaped stack in a crucible. Evaluation was carried out similarly to the Example 1. Results are shown in Table 2.

Example 3

A calcined powder of a piezoelectric ceramic material including PZT similar to that of Example 1 as the main component with the compound of group 2 element shown in Table 3 added, a binder made of an organic polymer and a plasticizer were mixed to prepare a slurry. The slurry was formed into ceramic green sheets having thickness of 150 μm by slip casting method. Then the column-shaped stack made similarly to the Example 1 was fired under the conditions shown in Table 3. The material precipitated on the surface was checked under a scanning electron microscope (SEM). Breakage strength test was also conducted at 150° C. similarly to Example 1, after leaving to stand in an atmosphere of 90% in humidity and 80° C. in temperature for 24 hours. Results are shown in Table 3.

In the actual product, grooves measuring 200 μm in depth and 75 μm in width in the stacking direction were formed in every other layer in a staggered configuration on the end face of the dielectric material layer 1 that included the end of the internal electrode 2, on the two opposing side faces 10a, 10b of the column-shaped stack 10. The grooves were filled with silicone rubber to form the insulating material 3, and the ends of the internal electrodes 2 were exposed on the opposing two side faces 10a, 10b of the column-shaped stack 10.

Then an electrically conductive adhesive made of silver and polyimide resin was applied to the opposing two side faces 10a, 10b of the column-shaped stack 10, a mesh member was embedded in the electrically conductive adhesive, and was heated to 200° C. to cure, thereby forming the external electrodes 4.

Then the lead wires 6 were connected to the external electrodes 4 by soldering. After cleaning the periphery of the multi-layer electronic component with alcohol or the like, the surface was treated by using a primer to improve the bonding property of the resin. Then after coating with silicone rubber by dipping or the like, a voltage of 1 kV was applied to carry out polarization treatment of the entire multi-layer electronic component, thereby to obtain the multi-layer electronic component of the present invention shown in FIG. 1.

When a DC voltage of 200 V was applied to the multi-layer electronic component, the multi-layer electronic component underwent displacement of 30 μm.

Example 4

Then samples of column-shaped stack were made similarly to the Example 1 while changing the firing conditions as shown in Table 4. Ten samples were subjected to operation test by applying AC voltage of 200 Hz alternating between 0 and +200 V at temperature of 150° C. The amount of expansion of the device after $1 \times 10^5$ cycles in this operation test was compared. Before printing the external electrodes on the column-shaped stack, capacitance of a dielectric material layer at 1 kHz was measured by applying probes of an impedance analyzer (HP-4292A) to the internal electrodes that sandwich the dielectric material layer. Dielectric constant was calculated from the capacitance and the thickness of the piezoelectric layer. Capacitance may also be measured by applying the probes to one internal electrode and the next electrode on the opposite side with the external electrode formed only on one side. A/B ratio of each layer was determined from Rietvelt analysis of XRD. Results of the test are shown in Table 4.

TABLE 1

|   | First firing step | | Second firing step | | Gap in crucible | | Pressure in crucible | Lead concentration in crucible |
|---|---|---|---|---|---|---|---|---|
|   | °C. | Duration | °C. | Duration | First firing step | Second firing step | | |
|   |   |   |   |   | mm | mm |   |   |
| 1 | 1,000 | 5 | 1,050 | 5 | 0 | 5 | $1^{st} > 2^{nd}$ | $1^{st} > 2^{nd}$ |
| 2 | 1,000 | 5 | 1,050 | 5 | 0 | 3 | $1^{st} > 2^{nd}$ | $1^{st} > 2^{nd}$ |
| 3 | 1,000 | 5 | 1,050 | 5 | 0 | 1 | $1^{st} > 2^{nd}$ | $1^{st} > 2^{nd}$ |
| 4 | 800 | 5 | 1,050 | 5 | 0 | 1 | $1^{st} > 2^{nd}$ | $1^{st} > 2^{nd}$ |
| *5 | 1,000 | 5 | 1,050 | 5 | 0 | 0 | $1^{st} < 2^{nd}$ | $1^{st} < 2^{nd}$ |
| 6 | 950 | 5 | 1,000 | 5 | 0 | 3 | $1^{st} > 2^{nd}$ | $1^{st} > 2^{nd}$ |
| 7 | 1,000 | 5 | 1,050 | 5 | 0.5 | 0.5 | $1^{st} = 2^{nd}$ | $1^{st} = 2^{nd}$ |
| 8 | 1,000 | 5 | 1,020 | 5 | 0 | 3 | $1^{st} > 2^{nd}$ | $1^{st} > 2^{nd}$ |

|   | Mean crystal grain size of dielectric material μm | Change in weight before and after firing % | Density after first firing step % | Amount of Pb compound Grains | Pb/Zr | Strength per three-point bending test at 150° C. Mpa |
|---|---|---|---|---|---|---|
| 1 | 2.5 | 1.2 | 95.0 | 0 | 10 | 160 |
| 2 | 2.3 | 0.8 | 95.0 | 1 | 20 | 140 |
| 3 | 2.1 | 0.3 | 95.0 | 2 | 30 | 130 |
| 4 | 1.6 | 4.0 | 80.0 | 2 | 80 | 100 |
| *5 | 1.8 | 0.0 | 95.0 | 10 | 150 | 50 |
| 6 | 1.8 | 0.5 | 88.0 | 2 | 30 | 150 |
| 7 | 1.9 | 0.2 | 97.0 | 2 | 40 | 110 |
| 8 | 1.8 | 0.6 | 95.0 | 1 | 30 | 130 |

TABLE 2

|   | First firing step | | Second firing step | | Lead absorbing material in crucible | | Pressure in crucible | Lead concentration in crucible |
|---|---|---|---|---|---|---|---|---|
|   | °C. | Duration | °C. | Duration | First | Second |   |   |
| 9 | 1,000 | 5 | 1,050 | 5 | None | MgO | $1^{st} > 2^{nd}$ | $1^{st} > 2^{nd}$ |
| 10 | 1,000 | 5 | 1,050 | 5 | None | $Al_2O_3$ | $1^{st} > 2^{nd}$ | $1^{st} > 2^{nd}$ |
| 11 | 1,000 | 5 | 1,050 | 5 | None | $ZrO_2$ | $1^{st} > 2^{nd}$ | $1^{st} > 2^{nd}$ |
| *12 | 1,000 | 5 | 1,050 | 5 | None | None | $1^{st} < 2^{nd}$ | $1^{st} < 2^{nd}$ |

|   | Mean crystal grain size of dielectric material μm | Change in weight before and after firing % | Density after first firing step % | Amount of Pb compound Grains | Pb/Zr | Strength per three-point bending test at 150° C. Mpa |
|---|---|---|---|---|---|---|
| 9 | 2.5 | 1.2 | 95.0 | 0 | 10 | 150 |
| 10 | 2.5 | 0.8 | 95.0 | 0 | 10 | 160 |
| 11 | 2.4 | 1.2 | 95.0 | 0 | 10 | 140 |
| *12 | 1.8 | 0.0 | 95.0 | 10 | 150 | 50 |

TABLE 3

|   | First firing step | | Second firing step | | Gap in crucible | | Pressure in crucible | Lead concentration in crucible |
|---|---|---|---|---|---|---|---|---|
|   | °C. | Duration | °C. | Duration | First firing step | Second firing step | | |
|   |   |   |   |   | mm | mm |   |   |
| *13 | 1,000 | 5 | 1,050 | 5 | 0 | 5 | $1^{st} > 2^{nd}$ | $1^{st} > 2^{nd}$ |
| 14 | 1,000 | 5 | 1,050 | 5 | 0 | 5 | $1^{st} > 2^{nd}$ | $1^{st} > 2^{nd}$ |
| 15 | 1,000 | 5 | 1,050 | 5 | 0 | 5 | $1^{st} > 2^{nd}$ | $1^{st} > 2^{nd}$ |
| 16 | 1,000 | 5 | 1,050 | 5 | 0 | 5 | $1^{st} > 2^{nd}$ | $1^{st} > 2^{nd}$ |
| 17 | 1,000 | 5 | 1,050 | 5 | 0 | 5 | $1^{st} > 2^{nd}$ | $1^{st} > 2^{nd}$ |

TABLE 3-continued

| | | | | | | | | |
|---|---|---|---|---|---|---|---|---|
| 18 | 1,000 | 5 | 1,000 | 5 | 0 | 5 | $1^{st} > 2^{nd}$ | $1^{st} > 2^{nd}$ |

| | Additive | Amount added Mol % | Precipitation on surface | Strength per three-point bending test at 150° C. after standing in humid atmosphere Mpa |
|---|---|---|---|---|
| *13 | — | — | None | 50 |
| 14 | $BaCO_3$ | 0.5 | Present | 160 |
| 15 | $SrCO_3$ | 0.5 | Present | 140 |
| 16 | $SrCO_3$ | 1.0 | Present | 170 |
| 17 | $CaCO_3$ | 0.5 | Present | 130 |
| 18 | $MgCO_3$ | 0.5 | Present | 150 |

TABLE 4

| No | Mode of firing | Firing temperature | Number of active layers | Amount of displacement (initial value) μm | Amount of displacement (after $1 \times 10^9$ cycles) | Changing ratio (%) |
|---|---|---|---|---|---|---|
| 19 | Fired | 980° C. | 300 | 30 | 29 | 33 |
| 20 | with lid | 1,000° C. | 300 | 30 | 28 | 6.7 |
| 21 | open | 980° C. | 300 | 30 | 30 | 0.0 |
| 22 | | 1,000° C. | 300 | 30 | 29 | 3.3 |
| *23 | Closed firing | 1,000° C. | 300 | 30 | Ruptured | Unable to measure |

| | Layer A nearest to inactive layer | | | | Layer B next nearest to inactive layer | | | |
|---|---|---|---|---|---|---|---|---|
| No | A/B ratio of PZT | Cap nF | Thickness of ceramic layer μm | Dielectric constant | A/B ratio of PZT | Cap nF | Thickness of ceramic layer μm | Dielectric constant |
| 19 | 1.01 | 3.67 | 120 | 1,100 | 1.00 | 3.33 | 120 | 1,000 |
| 20 | 1.01 | 3.33 | 120 | 1,000 | 0.99 | 3.00 | 120 | 900 |
| 21 | 1.01 | 3.38 | 130 | 1,100 | 1.00 | 3.33 | 120 | 1,000 |
| 22 | 1.01 | 3.08 | 130 | 1,000 | 0.99 | 3.00 | 120 | 900 |
| *23 | 1.01 | 3.67 | 120 | 1,100 | 1.01 | 3.67 | 120 | 1,100 |

| | Layer C furthest from inactive layer (central portion) | | | |
|---|---|---|---|---|
| | A/B ratio of PZT | Cap nF | Thickness of ceramic layer μm | Dielectric constant |
| 19 | 0.99 | 3.00 | 120 | 900 |
| 20 | 0.99 | 3.00 | 120 | 900 |
| 21 | 0.99 | 3.00 | 120 | 900 |
| 22 | 0.99 | 3.00 | 120 | 900 |
| *23 | 1.01 | 3.67 | 120 | 1,100 |

From Tables 1, 2, 3 and 4, it can be seen that samples Nos. 5 and 12 of the comparative example showed 3 or more grains of lead compound that remain in the crystal grain boundaries because of the absence of gap and absorbing material, higher pressure in the crucible and higher lead concentration in the second firing step than in the first step, and also showed lower strength at high temperatures because the ratio Pb/Zr dissolved into acetic acid solution was 100 or higher. Sample No. 13 showed decreased strength after being left to stand in humid atmosphere because group 2 element was not added. In sample No. 23, lead component did not evaporate because the crucible was kept airtight, thus resulting in no difference in the composition. As a result, the region in the vicinity of the inactive section showed the same dielectric constant as that of the central region, thus showing lower durability.

In contrast, samples Nos. 1 to 4 and 6 to 11 of the Example of the present invention, where the number of grains of Pb compound in the grain boundaries per 100 μm² is 2 or less and proportion Pb/Zr in weight of lead and zirconia that were dissolved in acetic acid was 100 or less, showed high strength at high temperatures. Samples Nos. 14 to 18 of the Example where group 2 element was added and precipitated on the surface did not show a decrease in strength after being left to stand in humid atmosphere. Excellent durability was obtained with samples Nos. 19 to 22 of the Example that were made by firing with the lid opened to let lead evaporate so as to cause a change in the composition thereby making the dielectric constant of the dielectric material layer in the vicinity of the inactive section higher than that of the central region of the active section.

The invention claimed is:
1. A multi-layer electronic component comprising:
an active stack section constituted from a plurality of dielectric material layers including lead and a plurality of internal electrodes which are stacked alternately one on another;
an upper inactive section provided on the top surface of the active stack section in the stacking direction thereof; and
a lower inactive section provided on the bottom surface of the active stack section in the stacking direction thereof,
wherein the plurality of dielectric material layers include a first upper dielectric material layer that has a dielectric constant $\epsilon_1$ and is disposed between a first upper internal electrode that is located at the top of the active stack and a second upper internal electrode located next to the first upper internal electrode, a first lower dielectric material layer that has a dielectric constant $\epsilon_2$ and is disposed between a first lower internal electrode that is located at the bottom of the active stack and a second lower internal electrode located next to the first lower internal electrode, and a central dielectric material layer that has a dielectric constant $\epsilon_3$ and is disposed at the center of the active stack, wherein each of the dielectric constants $\epsilon_1$ and $\epsilon_2$ are greater than the dielectric constant $\epsilon_3$.

2. The multi-layer electronic component according to claim 1, further comprising a plurality of dielectric material layers having a dielectric constant in a range from $\epsilon_1$ to $\epsilon_3$, the dielectric constant in each of the dielectric material layers gradually decreasing with closing central portion.

3. The multi-layer electronic component according to claim 1, further comprising a plurality of dielectric material layers having a dielectric constant in a range from $\epsilon_2$ to $\epsilon_3$, the dielectric constant in each of the dielectric material layers gradually decreasing with closing central portion.

4. The multi-layer electronic component as in one of claims 1-3, wherein the internal electrodes are made of a material including Ag as a main component.

* * * * *